(12) United States Patent
Afzali-Ardakani et al.

(10) Patent No.: US 10,170,719 B2
(45) Date of Patent: Jan. 1, 2019

(54) ORGANIC MONOLAYER PASSIVATION AND SILICON HETEROJUNCTION PHOTOVOLTAIC DEVICES USING THE SAME

(71) Applicant: International Business Machines Corporation, Armonk, NY (US)

(72) Inventors: Ali Afzali-Ardakani, Ossining, NY (US); Bahman Hekmatshoartabari, White Plains, NY (US); Davood Shahrjerdi, White Plains, NY (US)

(73) Assignee: INTERNATIONAL BUSINESS MACHINES CORPROATION, Armonk, NY (US)

( * ) Notice: Subject to any disclaimer, the term of this patent is extended or adjusted under 35 U.S.C. 154(b) by 120 days.

(21) Appl. No.: 14/964,876

(22) Filed: Dec. 10, 2015

(65) Prior Publication Data

US 2016/0380220 A1 Dec. 29, 2016

Related U.S. Application Data

(63) Continuation of application No. 14/749,956, filed on Jun. 25, 2015.

(51) Int. Cl.
*H01L 51/42* (2006.01)
*H01L 51/44* (2006.01)
*H01L 51/00* (2006.01)

(52) U.S. Cl.
CPC ........ *H01L 51/4213* (2013.01); *H01L 51/005* (2013.01); *H01L 51/0017* (2013.01); *H01L 51/441* (2013.01); *Y02E 10/549* (2013.01)

(58) Field of Classification Search
CPC ............. H01L 51/4213; H01L 51/0017; H01L 51/005; H01L 51/441; H01L 51/549

USPC ........................................................ 136/263
See application file for complete search history.

(56) References Cited

U.S. PATENT DOCUMENTS

| | | | |
|---|---|---|---|
| 2015/0228812 A1* | 8/2015 | Tanaka | H01L 31/02167 136/256 |
| 2016/0380219 A1 | 12/2016 | Afzali-Ardakani et al. | |
| 2018/0076406 A1 | 3/2018 | Afzali-Ardakani et al. | |

OTHER PUBLICATIONS

Hacker et al., Modifying electron transfer at the silicon-molecule interface using atomic tethers, Solid State Electronics, vol. 54, pp. 1-20, Aug. 10, 2010.*
Shen et al., Hybrid Heterojunction Solar Cell Based on Organic-Inorganic Silicon Nanowire Array Architecture, Journal of the American Chemical Society, vol./Issue 133, pp. 19408-19415 (Year: 2011).*
Liu et al., A dopant-free hole-transporting material for efficient and stable perovskite solar cells, Energy & Environmental Science, vol./Issue 7, pp. 2963-2967 (Year: 2014).*

(Continued)

*Primary Examiner* — Jayne L Mershon
(74) *Attorney, Agent, or Firm* — Cantor Colburn LLP; Vazken Alexanian

(57) ABSTRACT

A method for inorganic surface passivation in a photovoltaic device includes etching a native oxide over an inorganic substrate, the inorganic substrate having a surface; and forming an organic monolayer on the surface of the inorganic substrate to form a heterojunction, the organic monolayer having the following formula: ~X—Y, wherein X is an oxygen or a sulfur; Y is an alkyl chain, an alkenyl chain, or an alkynyl chain; and X covalently bonds to the surface of the inorganic substrate by a covalent bond.

11 Claims, 6 Drawing Sheets

(56) References Cited

OTHER PUBLICATIONS

List of IBM Patents or Patent Applications Treated as Related; (Appendix P), Filed Sep. 1, 2017; 2 pages.
List of IBM Patents or Patent Applications Treated as Related; (Appendix P), Filed Apr. 9, 2018; 2 pages.

* cited by examiner

ORGANIC MONOLAYER PASSIVATION AND SILICON HETEROJUNCTION PHOTOVOLTAIC DEVICES USING THE SAME

PRIORITY

This application is a continuation of and claims priority from U.S. patent application Ser. No. 14/749,956, filed on Jun. 25, 2015, entitled "ORGANIC MONOLAYER PASSIVATION AND SILICON HETEROJUNCTION PHOTOVOLTAIC DEVICES USING THE SAME", the entire contents of which are incorporated herein by reference.

BACKGROUND

The present invention generally relates to semiconductors, and more specifically, to passivation processes directed to photovoltaic devices.

Organic materials are of interest for photovoltaic applications for various reasons. For example, organic materials are relatively low in cost and can be processed over large surface areas, e.g., on flexible low-cost substrates. However, the efficiency of photovoltaic devices with such organic materials is lower than devices with inorganic materials. The smaller diffusion length of minority carriers in organic materials, compared to inorganic materials, can decrease efficiency.

Accordingly, heterojunction devices, such as in photovoltaic devices, that include an inorganic substrate (an absorption layer), for example silicon, with an organic contact are particularly attractive. Such devices combine the organic material's low-temperature, large-area processing capability with the inorganic material's large diffusion length, which substantially eliminates excessive recombination in the absorption layer.

In heterojunction devices, the dangling bonds at the surface of the inorganic material are passivated to minimize recombination loss at the organic/inorganic interface. Wide band gap materials, for example, PQ (9,10-phenanthrenequinone), have been used to passivate the surface of silicon (Si). Referring to FIG. 1, the lowest unoccupied molecular orbital (LUMO)/conduction band ($E_c$) offset in PQ repels minority electrons, which is favorable for reducing dark current. However, because of the highest occupied molecular orbital (HOMO)/valence band ($E_v$) offset at the Si/PQ interface, the potential barrier may reduce the collection of majority holes at the emitter junction and drastically reduce photocurrent. These effects hamper the use of mature hole-transport organic materials, such as pentacene (also shown in FIG. 1), to form a high-performance heterojunction solar cell devices on n-type silicon.

SUMMARY

In one embodiment of the present invention, a method for inorganic surface passivation in a photovoltaic device includes etching a native oxide over an inorganic substrate, the inorganic substrate having a surface; and forming an organic monolayer on the surface of the inorganic substrate to form a heterojunction, the organic monolayer having the following formula: ~X—Y, wherein X is an oxygen or a sulfur; Y is an alkyl chain, an alkenyl chain, or an alkynyl chain; and X covalently bonds to the surface of the inorganic substrate by a covalent bond.

In another embodiment, a method for inorganic surface passivation in a photovoltaic device includes etching a native oxide over an inorganic substrate, the inorganic substrate including silicon and having a surface; and forming an organic monolayer on the surface of the inorganic substrate to form a silicon heterojunction, the organic monolayer having the following formula: ~X—Y—Z, wherein X is an oxygen or a sulfur; Y is an alkyl chain, an alkenyl chain, or an alkynyl chain; Z is a methyl group or an epoxy group; and X covalently bonds to the surface of the inorganic substrate by a silicon-oxygen bond or a silicon-sulfur bond.

Yet, in another embodiment, a heterojunction in a photovoltaic device includes an inorganic substrate having a surface; and an organic monolayer on the surface of the inorganic substrate, the organic monolayer having the following formula: ~X—$(CH_2)_n$—$CH_3$, wherein X is an oxygen or a sulfur; n is an integer from about 4 to about 21; and X covalently bonds to the surface of the inorganic substrate to form a covalently bonded ether or a covalently bonded thioether on the surface; an organic semiconductor material on a surface of the organic monolayer, the organic semiconductor material being substantially free of doping; and a conductive electrode disposed onto at least on a portion of the organic semiconductor material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-4 illustrate various embodiments of inorganic surface passivation according according to the present invention, in which:

FIG. 2 illustrates inorganic surface passivation according to a first embodiment;

FIG. 3 illustrates inorganic surface passivation according to a second embodiment;

FIG. 4 illustrates inorganic surface passivation according to a third embodiment;

DETAILED DESCRIPTION

Figure 1:
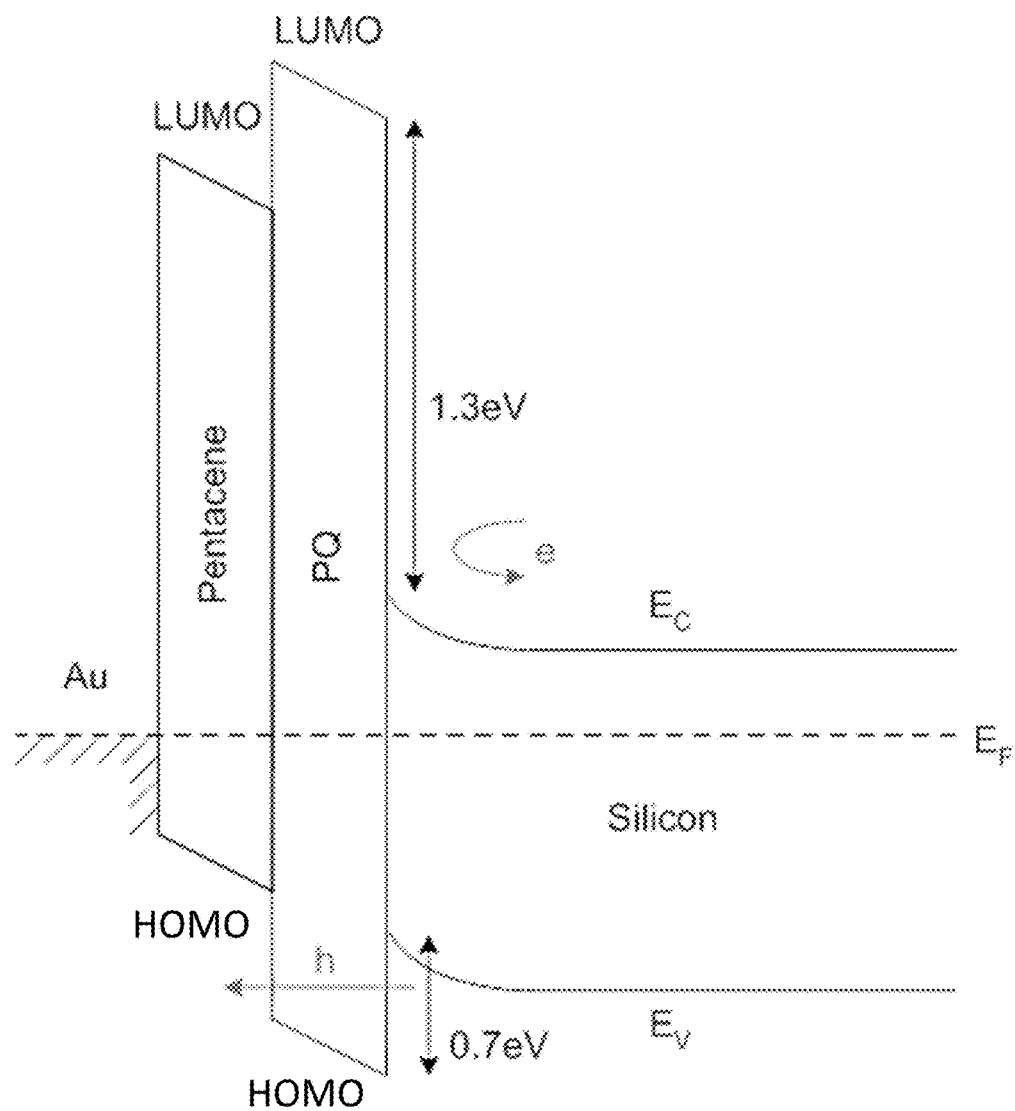
FIG. 1 illustrates a schematic diagram of HOMO/$E_v$ and LUMO/$E_c$ band offsets in silicon heterojunctions.

Disclosed herein is an organic monolayer and method for passivating the surface of an inorganic substrate, for example, a silicon substrate for use in photovoltaic devices. The passivation layer disclosed is a thin monolayer. As known in the art, the tunneling probability across a potential barrier depends on the barrier height and barrier thickness. The higher the barrier and the thicker the barrier, the lower the tunneling probability. However, if either of the barrier height or the barrier thickness approaches zero, the potential barrier approaches zero; hence, the tunneling probability approaches unity. Therefore, the potential barrier formed at the heterojunction due to the thin monolayer in accordance with the present invention is small, irrespective of any existing band offsets. Therefore, hole transport at the heterojunction is minimally affected because the hole tunneling probability across the thin potential barrier is high. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 2:
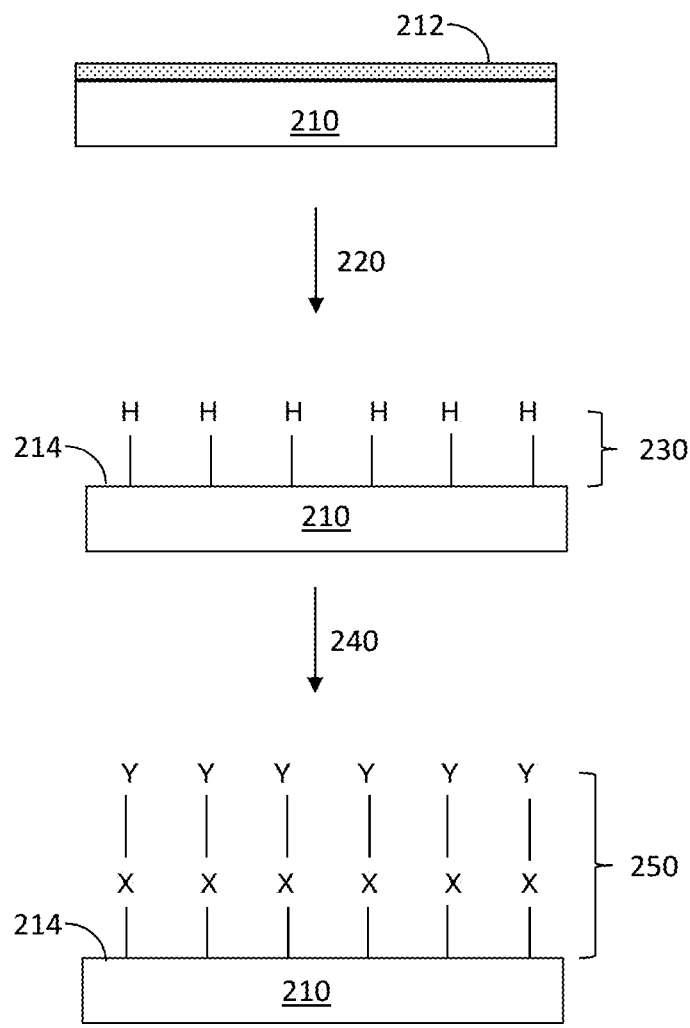
Figure 3:
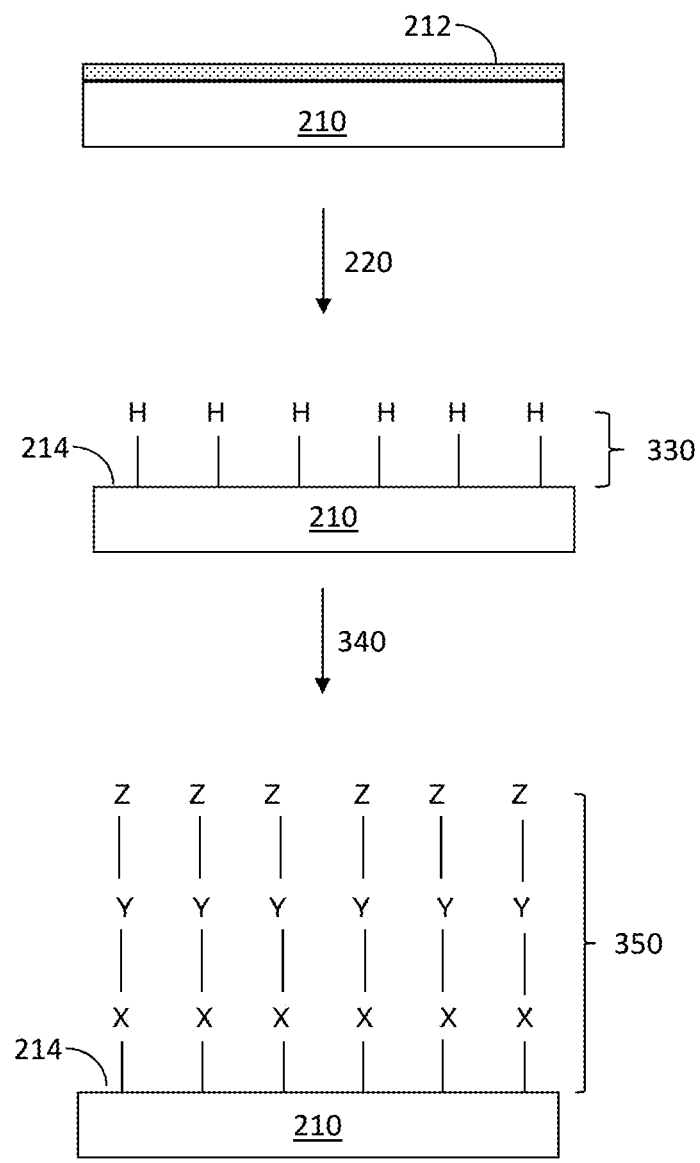
Figure 4:
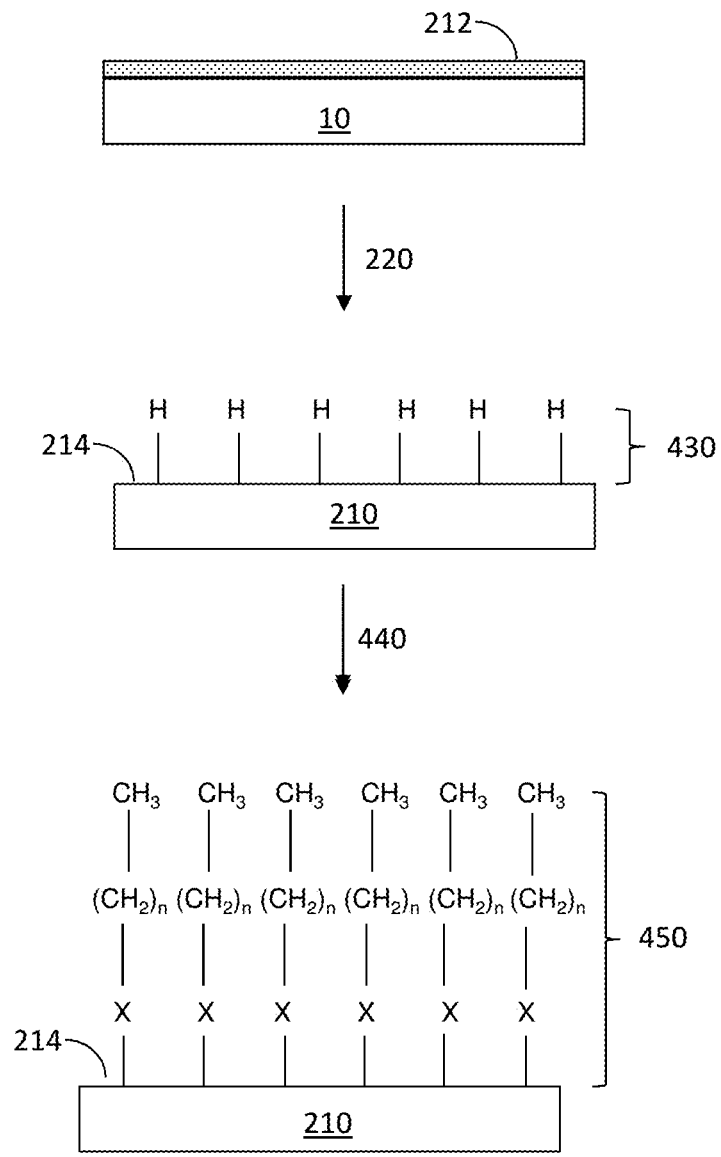

Turning now to the Figures, FIGS. 2-4 illustrate various embodiments of inorganic surface passivation for use in photovoltaic devices according according to the present invention. FIG. 2 illustrates inorganic surface passivation according to a first embodiment. An inorganic substrate 210 has a native oxide layer 212 on its surface. The inorganic substrate 210 may include crystalline silicon, n-type silicon, p-type silicon, or any combination thereof. The inorganic substrate 210 may include any other suitable inorganic material, including, but not limited to, group IV semiconductors such as Si, Ge, SiGe; and III-V semiconductors such as GaAs. The thickness of the inorganic substrate 210 is in a range from about 100 nm to about 1 mm; although thinner and thicker layers may be used as well. In one example, the inorganic substrate 210 is comprised of a solar-grade (single-crystalline or multi-crystalline) silicon wafer and has a thickness in the range from about 100 to about 300 micrometers (μm). In another example, the inorganic substrate 210 is comprised of a thin (1-20 μm) silicon layer transferred from a host silicon wafer and bonded onto a flexible handle substrate (such as plastic) using known layer transfer and bonding techniques. In a further example, the inorganic substrate 210 is comprised of a 100 nm-2 μm thick GaAs layer grown epitaxially on a Ge handle substrate. In yet another example, the inorganic substrate 210 is comprised of a 100 nm-2 μm thick GaAs layer transferred from a host substrate (such as Ge or GaAs) and bonded onto a flexible handle substrate (such as plastic) using known layer transfer and bonding techniques.

When the inorganic substrate 210 includes silicon, the native oxide layer 212 is etched 220 (removed) to form Si—H bonds 230 on the etched inorganic surface 214. When the inorganic substrate 210 includes another inorganic material, etching of the native oxide layer 212 forms an [inorganic atom —H] bond on the surface 214 of the inorganic substrate 210. The etching can be performed by applying a dilute solution of hydrofluoric acid (HF) to the native oxide layer 212 of the inorganic substrate 210 by methods known in the art. Etching to remove the native oxide layer 212 can be performed by other suitable methods, such as hydrogen plasma etching.

The inorganic substrate 210 is immersed in a solution of an alcohol or thiol 240 at an elevated temperature. The alcohol or the thiol 240 has the following formula: HX—Y, wherein H is hydrogen, X is sulfur or oxygen, and Y is an alkyl chain, an alkenyl chain, an alkynyl chain, or any combination thereof. Y can include any number of carbons, for example, in a range from about 4 to about 21. Y is substantially free of branching.

When Y is an alkenyl chain, the double bonds in the chain includes either all cis double bonds or all trans double bonds. When Y is an alkyl chain, Y can have the following formula: $(CH_2)_nCH_3$, wherein n is an integer from about 4 to about 21. The integer n can be about or in any range from about 4, 5, 6, 7, 8, 9, 10, 11, 12, 13, 14, 15, 16, 17, 18, 19, 20, and 21.

The reaction of the alcohol or thiol 240 with the inorganic substrate 210 is promoted by heating the inorganic substrate 210. The heating can be performed at a temperature in a range from about 90 to about 150° Celsius (° C.).

The organic atom —H bonds 230, for example, Si—H bonds, on the surface 214 of the inorganic substrate 210 react with the alcohol or the thiol 240 to form an organic monolayer 250 on the surface 214 of the inorganic substrate 210. The organic monolayer 250 passivates the surface 214 of the inorganic substrate 210 by saturating the dangling bonds. The organic monolayer 250 has the following formula: ~X—Y, wherein X is an oxygen or a sulfur; Y is an alkyl chain, an alkenyl chain, or an alkynyl chain; and X covalently bonds to the surface 214 of the inorganic substrate 210 by an inorganic atom-oxygen bond, for example, a silicon-oxygen bond (Si—O~) or a silicon-sulfur bond (Si—S~).

The organic monolayer 250 forms a passivation layer that is relatively thin, which means the potential barrier formed at the heterojunction between the organic monolayer 250 and the inorganic substrate 210 is small (irrespective of the existing band offset). Therefore, hole transport at the heterojunction is not affected.

The organic monolayer 250 has a thickness in a range from about 0.5 nm to about 5 nm. In one aspect, the organic monolayer 250 has a thickness in a range from about 2 to about 3 nm. In another aspect, the organic monolayer 250 has a thickness in a range from about 1 to about 2 nm. Yet, in another aspect, the organic monolayer 250 has a thickness about or in any range from about 0.5, 1.0, 1.5, 2.0, 2.5, 3.0, 3.5, 4.0, 4.5, and 5.0 nm.

FIG. 3 illustrates inorganic surface passivation for use in photovoltaic devices according to a second embodiment. An inorganic substrate 210 comprising silicon has a native oxide layer 212 on its surface. The native oxide layer 212 is etched 220 (removed) to form Si—H bonds 330 on the etched inorganic surface 214. The etching can be performed by applying a dilute solution of HF to the native oxide layer 212 of the inorganic substrate 210 by methods known in the art.

The inorganic substrate 210 is immersed in a solution of an alcohol or thiol 340 at an elevated temperature. The alcohol or the thiol 340 has the following formula: HX—Y—Z, wherein H is hydrogen; X is sulfur or oxygen, Y is an alkyl chain, an alkenyl chain, an alkynyl chain, or any combination thereof; and Z is a methyl group or an epoxy group. The X covalently bonds to the surface of the inorganic substrate 210 by a silicon-oxygen bond (Si—X~) or a silicon-sulfur bond (Si—S~). Any of the above descriptions for Y in the alcohol or thiol 240 having the formula HX—Y are applicable for HX—Y—Z.

The reaction of the alcohol or thiol 340 with the inorganic substrate 210 is promoted by heating the inorganic substrate 210. The Si—H bonds 330 on the surface 214 of the inorganic substrate 210 react with the alcohol or the thiol 340 to form an organic monolayer 350 on the surface 214 of the inorganic substrate 210. The organic monolayer 350 passivates the surface of the inorganic substrate 210 by saturating the dangling bonds.

The organic monolayer 350 has the following formula: ~X—Y—Z, wherein X is an oxygen or a sulfur; Y is an alkyl chain, an alkenyl chain, or an alkynyl chain; Z is a methyl group or an epoxy group; and X covalently bonds to the surface 214 of the inorganic substrate 210 by a silicon-oxygen bond (Si—O~) or a silicon-sulfur bond (Si—S~). The organic monolayer 350 forms a passivation layer that is relatively thin and has a thickness described above for organic monolayer 250.

FIG. 4 illustrates inorganic surface passivation for use in photovoltaic devices according to a third embodiment. An inorganic substrate 210 has a native oxide layer 212 on its surface. The inorganic substrate 210 can include, for example, silicon. The native oxide layer 212 is etched 220 (removed) to form organic atom —H bonds 430, for example, Si—H bonds, on the etched inorganic surface 214. The etching can be performed by applying a dilute solution of HF to the native oxide layer 212 of the inorganic substrate 210 by methods known in the art.

The inorganic substrate 210 is immersed in a solution of an alcohol or thiol 440 at an elevated temperature. The alcohol or the thiol 440 has the following formula: HX—$(CH_2)_n$—$CH_3$, wherein X is an oxygen or a sulfur, and n is an integer from about 4 to about 21. The integer n can be about or in any range from about 4, 5, 6, 7, 8, 9, 10, 11, 12, 13, 14, 15, 16, 17, 18, 19, 20, and 21.

The reaction of the alcohol or thiol 440 with the inorganic substrate 210 is promoted by heating the inorganic substrate 210. The inorganic atom —H bonds 430, for example Si—H bonds, on the surface 214 of the inorganic substrate 210 react with the alcohol or the thiol 440 to form an organic monolayer 450 on the surface 214 of the inorganic substrate 210. The organic monolayer 450 passivates the surface of the inorganic substrate 210 by saturating the dangling bonds.

The organic monolayer 450 has the following formula: ~X—$(CH_2)_n$—$CH_3$, wherein X is an oxygen or a sulfur; n is an integer from about 4 to about 21; and X covalently bonds to the surface of the inorganic substrate 210 to form a covalently bonded ether (e.g., Si—O—$(CH_2)_n$—$CH_3$) or a covalently bonded thioether (e.g., Si—S—$(CH_2)_n$—$CH_3$) on the surface 214 of the inorganic substrate 210. The integer n can be about or in any range from about 4, 5, 6, 7, 8, 9, 10, 11, 12, 13, 14, 15, 16, 17, 18, 19, 20, and 21. The organic monolayer 350 forms a passivation layer that is relatively thin and has a thickness described above for organic monolayer 250.

In the above-described embodiments in FIGS. 2, 3, and 4, hybrid heterojunctions are formed between the inorganic substrate 210 and a conductive electrode (not shown). The hybrid heterojunctions further include at least one organic semiconductor material layer together with the organic monolayers 250, 350, and 450. The organic semiconductor material is over the organic monolayer, and the conductive electrode is disposed onto at least a portion of the organic semiconductor material.

The said heterojunctions are configured to effectively behave as Schottky barriers by (i) choosing the conductive electrode to have a work-function type opposite to that of the inorganic substrate (i.e., if the inorganic substrate is n-type, the conductive electrode is chosen to have a high work-function, and if the inorganic substrate is p-type, the conductive electrode is chosen to have a low work-function); (ii) choosing the organic semiconductor to be substantially free of impurities, have a low defect density, and be sufficiently thin to ensure low minority carrier recombination within the organic materials, and to ensure the organic semiconductor is fully depleted; and (iii) choosing the organic semiconductor to suppress the transport of carriers having the same charge type as that of the majority carriers in the inorganic substrate and/or favor the transport of carriers having the opposite charge type to that of the majority carriers in the inorganic substrate (i.e., if the inorganic substrate is n-type (wherein electrons are the majority carriers), the organic semiconductor is chosen to be an electron blocking and/or a hole transport material, and if the inorganic substrate is p-type (wherein holes are the majority carriers), the organic semiconductor is chosen to be a hole blocking and/or an electron transport material). Further, the organic monolayers 250, 350, and 450 ensure good surface passivation of the inorganic substrate, and therefore, a low minority carrier recombination. Under the above conditions, the contribution of minority carriers to the electronic transport is low, and the electronic transport is dominated by the majority carrier transport across the said Schottky barrier.

The organic semiconductor material is substantially undoped or substantially free of doping. Examples of organic semiconductor materials which can provide electron blocking (or hole transport) functions include, but are not limited to, pentacene, rubrene, anthracene, poly(3-hexylthiophene) (P3HT); tetraceno[2,3-b]thiophene; α-sexithiophene; poly (3,3'''-didodecylquaterthiophene); poly(2,5-bis(3-decylthiophen-2-yl)thieno[3,2-b]thiophene); N,N'-Bis(3-methylphenyl)-N,N'-diphenyl-benzidine (TPD); N,N'-Bis (phenanthren-9-yl)-N,N'-bis(phenyl)-benzidine (PAPB); 4,4'-Bis(N-carbazolyl)-1,1'-biphenyl (CBP); 1,3-Bis(N-carbazolyl)benzene (mCp); 4,4'-Cyclohexylidenebis[N,N-bis (4-methylphenyl)benzenamine] (TAPC); 2,2'-Dimethyl-N, N'-di-[(1-naphthyl)-N,N'-diphenyl]-1,1'-biphenyl-4,4'-diamine (α-NPD); 9,9-Dimethyl-N,N'-di(1-naphthyl)-N,N'-diphenyl-9H-fluorene-2,7-diamine (NPB); N,N'-Di-[(1-naphthyl)-N,N'-diphenyl]-1,1'-biphenyl]-4,4'-diamine (NPD); N,N'-Di(2-naphthyl-N,N'-diphenyl)-1,1'-biphenyl-4,4'-diamine (β-NPB); Tri-p-tolylamine; 4,4',4''-Tris[phenyl (m-tolyl)amino]triphenylamine; Tris(4-carbazoyl-9-ylphenyl)amine (TCTA); Tetra-N-phenylbenzidine (TPB); 1,3-Bis(triphenylsilyl)benzene; poly-aniline; poly(3,4-ethylenedioxythiophene); poly(3,4-ethylenedioxythiophene)-poly(styrenesulfonate) (PEDOT: PSS); poly(3,4-ethylenedioxythiophene);

tetracyanoethylene; poly(thiophene-3-[2-(2-methoxy-ethoxy) ethoxy]-2,5-diyl); bis-poly(ethyleneglycol) (PE-DOT:PEG); 7,7,8,8-Tetracyanoquinodimethane, and combinations thereof.

Examples of organic semiconductor materials which can provide hole blocking (or electron transport) functions include, but are not limited to, bathocuproine (BCP); bathophenanthroline (BPhen); 3-(Biphenyl-4-yl)-5-(4-tert-butyl-phenyl)-4-phenyl-4H-1,2,4-triazole (TAZ); 2-(4-Biphenylyl)-5-phenyl-1,3,4-oxadiazole (PBD); bis(8-hydroxy-2-methylquinoline)-(4-phenylphenoxy)aluminum; 2,5-Bis(1-naphthyl)-1,3,4-oxadiazole (BND); 2-(4-tert-Butylphenyl)-5-(4-biphenylyl)-1,3,4-oxadiazole (Butyl-PBD); Tris-(8-hydroxyquinoline)aluminum (Alq3); hexadecafluoro copper phthalocyanine ($F_{16}$CuPc); naphthalene diimide derivatives; perylene diimide derivatives; $C_{60}$; and combinations thereof.

The conductive electrode may include a metal (blanket or grid). The conductive electrode may include, or further include, a transparent conductive material, such as a transparent conductive oxide. Non-limiting examples of transparent conductive oxides include aluminum-doped zinc-oxide and indium-tin-oxide, a conductive polymer such as PEDOT:PSS, a 2D material such as graphene, or metal nano-structures such as silver nano-wires. Non-limiting examples of high work-function metals include gold, platinum, palladium, and silver. Non-limiting examples of low work-function metals include erbium, strontium, and calcium. In some embodiments, the thickness of the organic semiconductor material is in a range from about 2 nm to about 200 nm. In other embodiments, the thickness of the organic semiconductor material is in a range from about 3 nm to about 25 nm. In yet another set of embodiments, the thickness of the organic semiconductor material is in a range from about 5 nm to about 15 nm.

EXAMPLE

Figure 5A:
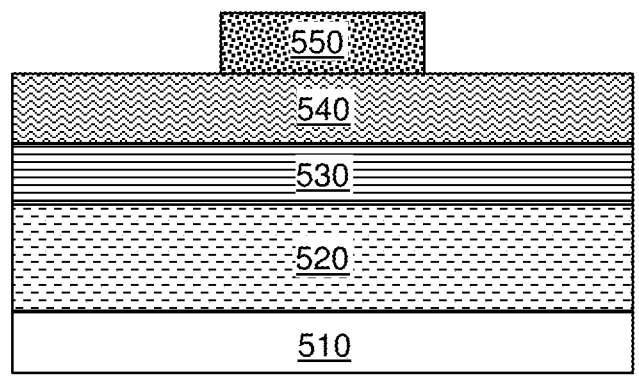
FIG. 5A illustrates an exemplary semiconducting stack comprising a surface passivated silicon substrate.

FIG. 5A illustrates an exemplary semiconducting stack comprising a surface passivated silicon substrate. It should be appreciated that the illustration of the example of FIG. 5A is not shown to scale. The semiconducting stack included an aluminum layer 510 with a 300 μm n-type Si substrate 520 disposed thereon. The Si substrate 520 included a passivation layer 530. For comparison, the passivation layer 530 was a 5 nm thick PQ layer or an organic monolayer as disclosed herein. A 10 nm pentacene layer 540 was disposed on the passivation layer 540. A 1 mm² gold pad 550 was disposed on the pentacene layer 540. These devices were prepared to demonstrate the differences between Si/PQ heterojunction structures and Si/organic monolayer heterojunction structures.

Figure 5B:
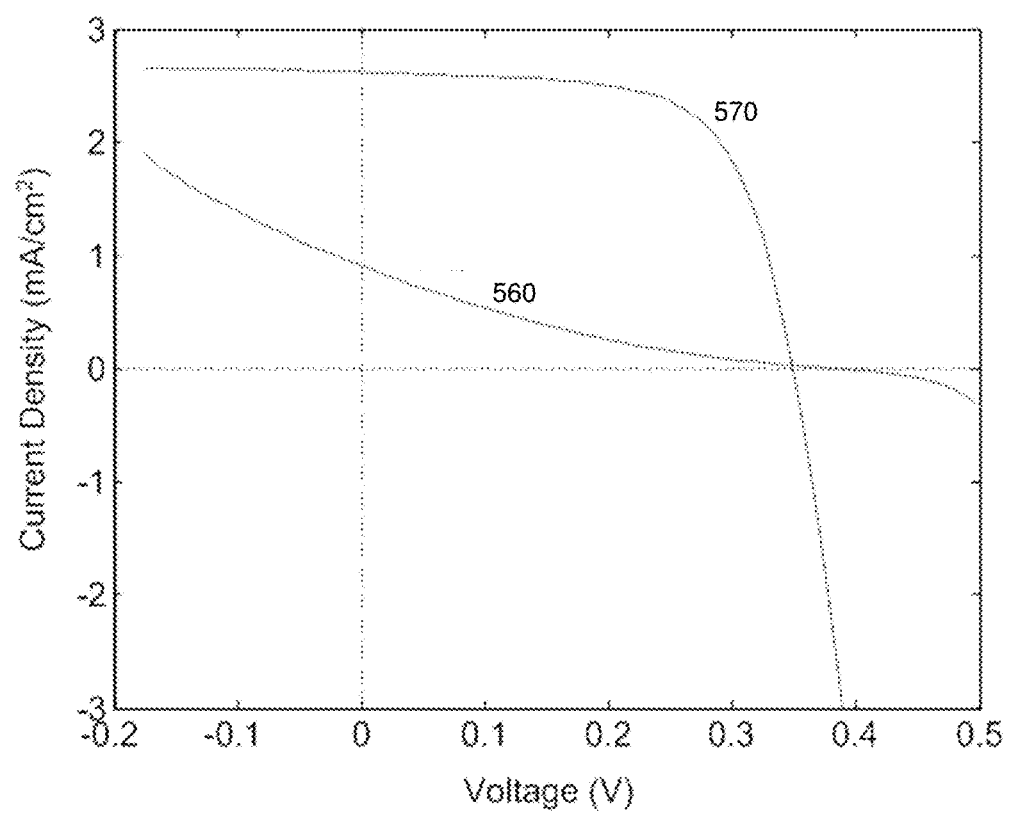
FIG. 5B is a graph comparing current density as a function of voltage in the stacks of FIG. 5A.

FIG. 5B is a graph comparing current density as a function of voltage in the Si/PQ (560) and Si/organic monolayer (570) heterojunction structures of FIG. 5A. The fill factors for each of the structures were assessed. The fill factor is the ratio of the actual maximum obtainable power to the product of the open circuit voltage and short circuit current, which is a parameter in evaluating performance. As shown, the Si/PQ structure 560 had a fill-factor of 17%, but the Si/organic monolayer structure 570 had an increased fill-factor of 65%. The Si/organic monolayer structure also demonstrated a substantial increase of short circuit density (more than 2.5×).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for inorganic passivation in a photovoltaic device, the method comprising:
   etching a native oxide over an inorganic substrate, the inorganic substrate having a surface;
   forming an organic monolayer directly on the surface of the inorganic substrate to form a heterojunction, the organic monolayer having the following formula:

~X—Y, wherein X is an oxygen or a sulfur; Y is an alkyl chain, an alkenyl chain, or an alkynyl chain; and X covalently bonds to the surface of the inorganic substrate by a covalent bond;
   depositing an organic semiconductor material directly on a surface of the organic monolayer, the organic semiconductor material being substantially free of doping; and
   disposing a conductive electrode directly on at least on a portion of the organic semiconductor material;
   wherein the organic semiconductor material comprises an electron blocking or a hole transport material when the inorganic substrate comprises an n-type inorganic material, and the organic semiconductor material comprises a hole blocking or electron transport material when the inorganic substrate comprises a p-type inorganic material.

2. The method of claim 1, wherein the inorganic substrate comprises silicon.

3. The method of claim 1, wherein the etching of the native oxide comprises etching with hydrofluoric acid (HF).

4. The method of claim 1, wherein Y has about 4 to about 21 carbons.

5. The method of claim 1, wherein the organic monolayer has a thickness in a range from about 0.5 nanometers (nm) to about 5 nm.

6. The method of claim 1, wherein forming the organic monolayer on the surface of the inorganic substrate further comprises heating the inorganic substrate in the presence of a compound having the following formula: HX—Y.

7. The method of claim 6, wherein the heating is performed at a temperature in a range from about 90 to about 150° Celsius (° C.).

8. A method for inorganic passivation in a photovoltaic device, the method comprising:
- etching a native oxide over an inorganic substrate, the inorganic substrate comprising silicon and having a surface;
- forming an organic monolayer directly on the surface of the inorganic substrate to form a silicon heterojunction, the organic monolayer having the following formula:

~X—Y—Z, wherein X is an oxygen or a sulfur; Y is an alkyl chain, an alkenyl chain, or an alkynyl chain; Z is a methyl group or an epoxy group; and X covalently bonds to the surface of the inorganic substrate by a silicon-oxygen bond or a silicon-sulfur bond;

- depositing an organic semiconductor material directly on a surface of the organic monolayer, the organic semiconductor material being substantially free of doping; and

- disposing a conductive electrode directly on at least on a portion of the organic semiconductor material;

wherein the organic semiconductor material comprises an electron blocking or a hole transport material when the inorganic substrate comprises an n-type inorganic material, and the organic semiconductor material comprises a hole blocking or electron transport material when the inorganic substrate comprises a p-type inorganic material.

9. The method of claim 8, wherein the Y is an alkenyl chain comprising all cis double bonds or all trans double bonds.

10. The method of claim 8, wherein Y is substantially free of branching.

11. The method of claim 8, wherein the silicon heterojunction is further processed to form a portion of a photovoltaic device.

* * * * *